(12) United States Patent
Ohse et al.

(10) Patent No.: US 8,568,606 B2
(45) Date of Patent: Oct. 29, 2013

(54) SUBSTRATE PROCESSING APPARATUS AND SUBSTRATE PROCESSING METHOD USING SAME

(75) Inventors: Takeshi Ohse, Nirasaki (JP); Shinji Himori, Nirasaki (JP); Jun Abe, Nirasaki (JP); Norikazu Yamada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 406 days.

(21) Appl. No.: 12/750,015

(22) Filed: Mar. 30, 2010

(65) Prior Publication Data
US 2010/0243607 A1    Sep. 30, 2010

Related U.S. Application Data

(60) Provisional application No. 61/242,650, filed on Sep. 15, 2009.

(30) Foreign Application Priority Data

Mar. 31, 2009 (JP) ................... 2009-086035

(51) Int. Cl.
*C03C 15/00* (2006.01)

(52) U.S. Cl.
USPC ............... 216/67; 216/37; 438/729; 438/776

(58) Field of Classification Search
USPC ........ 216/37, 67; 438/729, 776; 118/696, 723
See application file for complete search history.

(56) References Cited

U.S. PATENT DOCUMENTS

| | | | |
|---|---|---|---|
| 6,770,166 B1 * | 8/2004 | Fischer | 156/345.47 |
| 7,754,615 B2 * | 7/2010 | Panda et al. | 438/714 |
| 2004/0219797 A1 | 11/2004 | Honda et al. | |
| 2004/0242021 A1 * | 12/2004 | Kraus et al. | 438/776 |

FOREIGN PATENT DOCUMENTS

| | | | |
|---|---|---|---|
| JP | 8-250479 A | | 9/1996 |
| JP | 2000-54125 | * | 2/2000 |
| JP | 2003-234331 | | 8/2003 |
| JP | 2009-33080 A | | 2/2009 |

OTHER PUBLICATIONS

Chinese Office Action issued May 11, 2011, in Patent Application No. 201010155002.X (with English-language translation).
S. B. Wang, et al., "Control of ion energy distribution at substrates during plasma processing", Journal of Applied Physics, vol. 88, No. 2, Jul. 15, 2000, pp. 643-646.

* cited by examiner

*Primary Examiner* — Duy Deo
*Assistant Examiner* — Maki Angadi
(74) *Attorney, Agent, or Firm* — Rothwell, Figg, Ernst & Manbeck, P.C.

(57) ABSTRACT

A substrate processing method uses a substrate processing apparatus including a chamber for accommodating a substrate, a lower electrode to mount the substrate, a first RF power applying unit for applying an RF power for plasma generation into the chamber, and a second RF power applying unit for applying an RF power for bias to the lower electrode. The RF power for plasma generation is controlled to be intermittently changed by changing an output of the first RF power applying unit at a predetermined timing. If no plasma state or an afterglow state exists in the chamber by a control of the first RF power applying unit, an output of the second RF power applying unit is controlled to be in an OFF state or decreased below an output of the second RF power applying unit when the output of the first RF power applying unit is a set output.

18 Claims, 11 Drawing Sheets

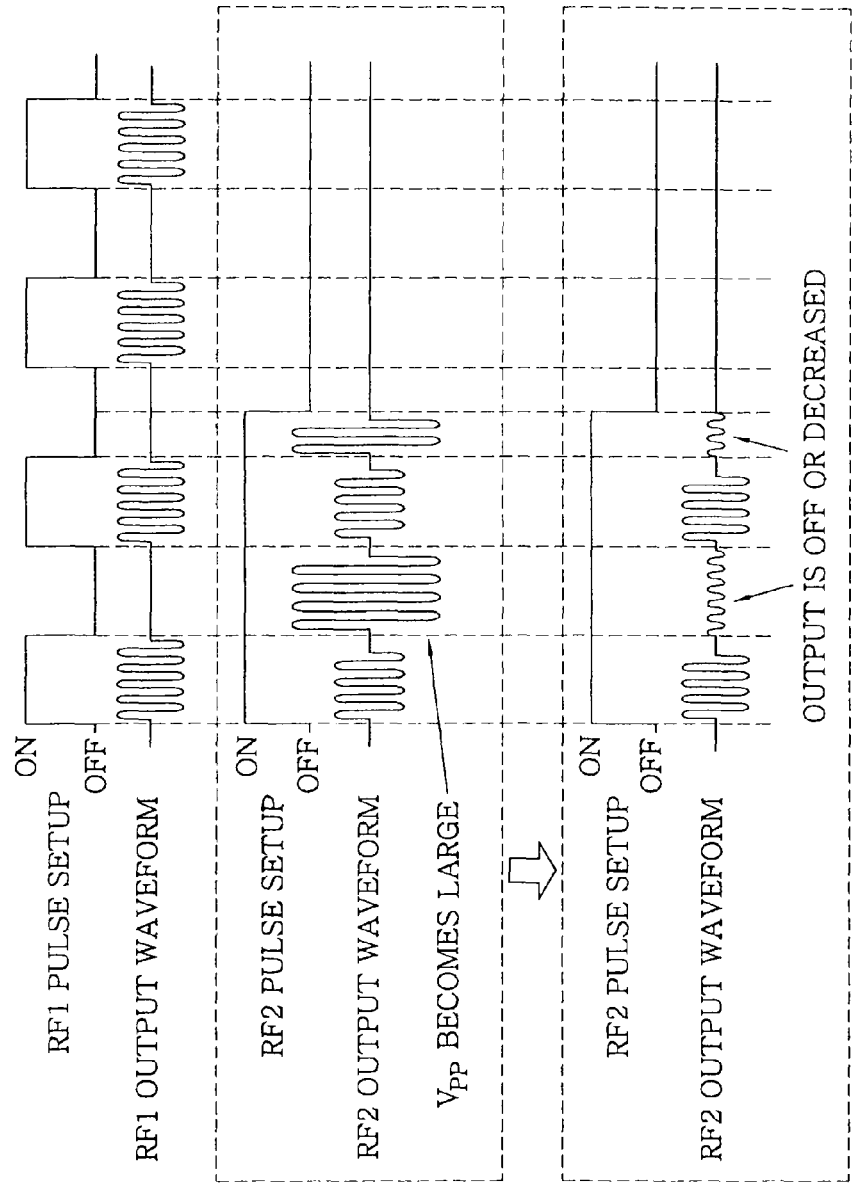

SUBSTRATE PROCESSING APPARATUS AND SUBSTRATE PROCESSING METHOD USING SAME

CROSS-REFERENCE TO RELATED APPLICATIONS

This application claims priority to Japanese Patent Application No. 2009-086035 filed on Mar. 31, 2009 and U.S. Provisional Application No. 61/242,650 filed on Sep. 15, 2009, the entire contents of which are incorporated herein by reference.

FIELD OF THE INVENTION

The present invention relates to a substrate processing apparatus and a substrate processing method using same, and, more particularly, to a substrate processing apparatus and method for subjecting a substrate to a predetermined process using a plasma generated when a process gas is excited.

BACKGROUND OF THE INVENTION

When wiring and the like are formed on a substrate such as a semiconductor wafer, the substrate is required to be subjected to a fine processing and a substrate processing method using a plasma has been widely employed therefor.

The reactive ion etching (RIE) is widely employed in the field of semiconductor processing to process semiconductor devices, various substrates, composite films, and the like. Recently, a technique for narrowing a range of ion energy by increasing the frequency of RF (Radio Frequency) power and that for generating a pulsed plasma have been studied to meet the requirement for high precision of shapes of processed objects or the like.

For example, Patent Document 1 (Japanese Patent Application Publication No. 2003-234331) is one of published documents which disclose a technique for increasing RF power to a higher frequency. Patent Document 1 discloses a method for supplying two different radio frequency (RF) powers to electrodes of a parallel plate and independently controlling plasma density with a higher RF power and an average incident energy to substrate with a lower RF power in order to improve controllability of the plasma density and average incident energy to substrate. Further, Patent Document 1 discloses a technique for overlapping a higher RF power and a lower RF power in an RF electrode using an RF power supply and a matching unit for the lower RF power provided in addition to an RF power supply and a matching unit for the higher RF power.

Non-Patent Document 1 (J. Appl. Phys. Vol 86 Not 643 (2000)) is an example of published documents which disclose techniques for generating pulsed plasma. Non-Patent Document 1 discloses a technique for generating a pulsed plasma in a substrate processing method using a plasma, in which a plasma-generating gas is prevented from being dissociated by performing a pulse control of RF power for plasma generation.

In addition, there has been known a technique for controlling an average incident energy to substrate in a pulsing manner by applying a lower frequency RF power in the form of a pulse.

Further, there has been known a combination of the technique of generating a pulsed plasma by applying a higher frequency RF power in the form of a pulse and the technique of controlling the average incident energy to substrate in a pulsing manner by applying a lower frequency RF power in the form of a pulse.

However, in such a substrate processing method, if a balance is disturbed between an ON/OFF control of a RF power supply for plasma generation (hereinafter referred to as "excitation power applying device") and an ON/OFF control of a RF power supply for bias (hereinafter referred to as "bias power applying device"), an amplitude (Vpp) of bias RF power may become excessively large, which may result in abnormal discharge and/or damage of an RF matching part of a matching unit, thereby making it difficult to perform a stable substrate process.

SUMMARY OF THE INVENTION

In view of the above, the present invention provides a substrate processing apparatus and method which is capable of adjusting timings of output variation including ON/OFF of an excitation power applying device and output variation including ON/OFF of a bias power applying device and suppressing an amplitude (Vpp) of bias RF power from being increased, thereby preventing a problem such as abnormal discharge and the like from occurring.

Further, the present invention also provides a substrate processing apparatus and method capable of adjusting timings of output variation including ON/OFF of an excitation power applying device and output variation including ON/OFF of a DC voltage apply part for applying a bias DC voltage to a lower electrode, thereby suppressing heat from being generated due to the DC voltage and preventing the bias DC voltage applying part from being damaged due to load increase.

In accordance with a first aspect of the present invention, there is provided a substrate processing method using a substrate processing apparatus including a chamber for accommodating a substrate, a lower electrode disposed in the chamber to mount the substrate, a first RF power applying unit for applying an RF power for plasma generation into the chamber, and a second RF power applying unit for applying an RF power for bias to the lower electrode, the method including: controlling the RF power for plasma generation to be intermittently changed by changing an output of the first RF power applying unit at a predetermined timing, and if no plasma state or an afterglow state exists in the chamber by a control of the first RF power applying unit, controlling an output of the second RF power applying unit to be in an OFF state or decreased below an output of the second RF power applying unit when the output of the first RF power applying unit is a set output.

In the substrate processing method, a period of time during which the output of the second RF power applying unit is in the OFF state and is decreased may be longer than a period of time during which no plasma state or the afterglow state exists in the chamber by the control of the first RF power applying unit.

In accordance with a second aspect of the present invention, there is provided a substrate processing apparatus, including: a chamber for accommodating a substrate; a lower electrode disposed in the chamber to mount the substrate; a first RF power applying unit for applying RF power for plasma generation into the chamber; a second RF power applying unit for applying RF power for bias to the lower electrode; and a controller which controls the RF power for plasma generation to be intermittently changed by changing an output of the first RF power applying unit at a predetermined timing, and if no plasma state or an afterglow state exists in the chamber by a control of the first RF power applying unit, controls an output of the second RF power applying unit to be in an OFF state or decreased below an output of the second RF power applying unit when the output of the first RF power applying unit is a set output.

In accordance with a third aspect of the present invention, there is provided a substrate processing method using a substrate processing apparatus including a chamber for accommodating a substrate, a lower electrode disposed in the chamber to mount the substrate, an RF power applying unit for applying RF power for plasma generation into the chamber, and a DC voltage applying unit for applying a DC voltage for bias to the lower electrode, controlling the RF power for plasma generation to be intermittently changed by changing an output of the RF power applying unit at a predetermined timing, and if no plasma state or an afterglow state exists in the chamber by a control of the RF power applying unit, controlling an output of the DC voltage applying unit to be decreased below an output of the DC voltage applying unit when the output of the RF power applying unit is a set output.

In the substrate processing method, a period of time during which the output of the DC voltage applying unit is decreased may be longer than a period of time during which no plasma state or an afterglow state exists in the chamber by the control of the RF power applying unit.

In accordance with a fourth aspect of the present invention, there is provided a substrate processing apparatus, including: a chamber for accommodating a substrate; a lower electrode disposed in the chamber to mount the substrate; an RF power applying unit for applying RF power for plasma generation into the chamber; a DC voltage applying unit for applying a DC voltage for bias to the lower electrode; and a controller which controls the RF power for plasma generation to be intermittently changed by changing an output of the RF power applying unit at a predetermined timing, and if no plasma state or an afterglow state exists in the chamber by a control of the RF power applying unit, controls an output of the DC voltage applying unit to be decreased below an output of the DC voltage applying unit when the output of the RF power applying unit is a set output.

In accordance with one of the advantageous features of the present invention, since the first RF power for plasma generation is controlled to be intermittently changed by changing an output of the first RF power applying unit at a predetermined timing, and if no plasma state or an afterglow state exists in the chamber by a control of the first RF power applying unit, an output of the second RF power applying unit is controlled to be in an OFF state or decreased below an output of the second RF power applying unit when the output of the first RF power applying unit is a set output, it is possible to prevent the amplitude (Vpp) of the RF power for bias from being increased, thereby avoiding abnormal discharge, a damage of an RF matching unit, and the like.

Further, in accordance with another feature of the substrate processing method, since the output of the second RF power applying unit is adjusted such that an amplitude (Vpp) of the RF power for bias when the output of the second RF power applying unit is decreased does not exceed an amplitude (Vpp) of the RF power for bias when the output of the first RF power applying unit is the set output, the amplitude (Vpp) of the RF power for bias never exceeds the amplitude (Vpp) of the RF power for bias when the first RF power applying unit is in the ON state, even if the second RF power applying unit is not in the OFF state, thereby avoiding abnormal discharge and the like.

Further, in accordance with another feature of the substrate processing method, since a period of time during which the output of the second RF power applying unit is in the OFF state and is decreased is longer than a period of time during which no plasma state or the afterglow state exists in the chamber by the control of the first RF power applying unit, it is possible to prevent the output of the second RF power applying unit from becoming the set output when no plasma state or an afterglow state exists in the chamber by the control of the first RF power applying unit.

Further, in accordance with another feature of the substrate processing method, since the RF power for bias is controlled to be intermittently changed by making the second RF power applying unit switch between an ON state and one of an OFF state and power-decreased state at a preset timing, it is possible to achieve optimization of time of exhaustion of reaction products.

Further, in accordance with another feature of the substrate processing method, since a pulse duration during which the output of the first RF power applying unit is changed is different from a pulse duration during which the output of the second RF power applying unit is changed, it is possible to facilitate independent control of output variation of the first RF power applying unit and output variation of the second RF power applying unit and reliably prevent the output of the second RF power applying unit from becoming the set output when the chamber has no plasma state or an afterglow state by the control of the first RF power applying unit.

Further, in accordance with another feature of the substrate processing method, since a pulse frequency at which the output of the first RF power applying unit is changed ranges from 100 Hz to 100 kHz and a pulse frequency at which the output of the second RF power applying unit is changed ranges from 1 Hz to 1 kHz, it is possible to efficiently generate plasma by exciting process gas components.

Further, in accordance with another feature of the substrate processing method and the substrate processing apparatus, since the RF power for plasma generation may be controlled to be intermittently changed by changing an output of the RF power applying unit at a predetermined timing, and if no plasma state or an afterglow state exists in the chamber by a control of the RF power applying unit, an output of the DC voltage applying unit may be controlled to be decreased below an output of the DC voltage applying unit when the output of the RF power applying unit is a set output, it is possible to suppress heat generation due to the DC voltage and prevent the DC voltage applying unit from being damaged due to increase in its load.

Further, in accordance with another feature of the substrate processing method, since the output of the DC voltage applying unit is adjusted such that an amount of heat generated by the DC voltage applied to the lower electrode when the output of the DC voltage applying unit is decreased does not exceed an amount of heat generated by the DC voltage applied to the lower electrode when the output of the RF power applying unit is the set output, it is possible to effectively prevent the DC voltage applying unit from being damaged due to increase in its load.

Further, in accordance with another feature of the substrate processing method, since a period of time during which the output of the DC voltage applying unit is decreased is longer than a period of time during which no plasma state or an afterglow state exists in the chamber by the control of the RF power applying unit, it is possible to prevent the output of the DC voltage applying unit from becoming the set output when no plasma state or an afterglow state exists in the chamber by the control of the RF power applying unit, and suppress heat generation due to the DC voltage.

Further, in accordance with another feature of the substrate processing method, since a DC voltage applied to the lower electrode is controlled to be intermittently changed by decreasing the output of the DC voltage applying unit at a preset timing, it is possible to achieve optimization of time of exhaustion of reaction products.

Further, in accordance with another feature of the substrate processing method, since a pulse duration during which the output of the RF power applying unit is changed is different from a pulse duration during which the output of the DC voltage applying unit is changed, it is possible to reliably prevent the output of the DC voltage applying unit from becoming the set output when no plasma state or an afterglow state exists in the chamber by the control of the RF power applying unit.

Further, in accordance with another feature of the substrate processing method, since a pulse frequency at which the output of the RF power applying unit is changed ranges from 100 Hz to 100 kHz and a pulse frequency at which the output of the DC voltage applying unit is changed ranges from 100 kHz to 1 MHz, it is possible to efficiently generate plasma by exciting process gas components.

BRIEF DESCRIPTION OF THE DRAWINGS

The objects and features of the present invention will become apparent from the following description of embodiments, given in conjunction with the accompanying drawings, in which:

FIG. 3 is a timing diagram of a first embodiment of a substrate processing method of the present invention;

DETAILED DESCRIPTION OF THE EMBODIMENTS

Hereinafter, embodiments of the present invention will be described with reference to the accompanying drawings which form a part hereof.

Figure 1:
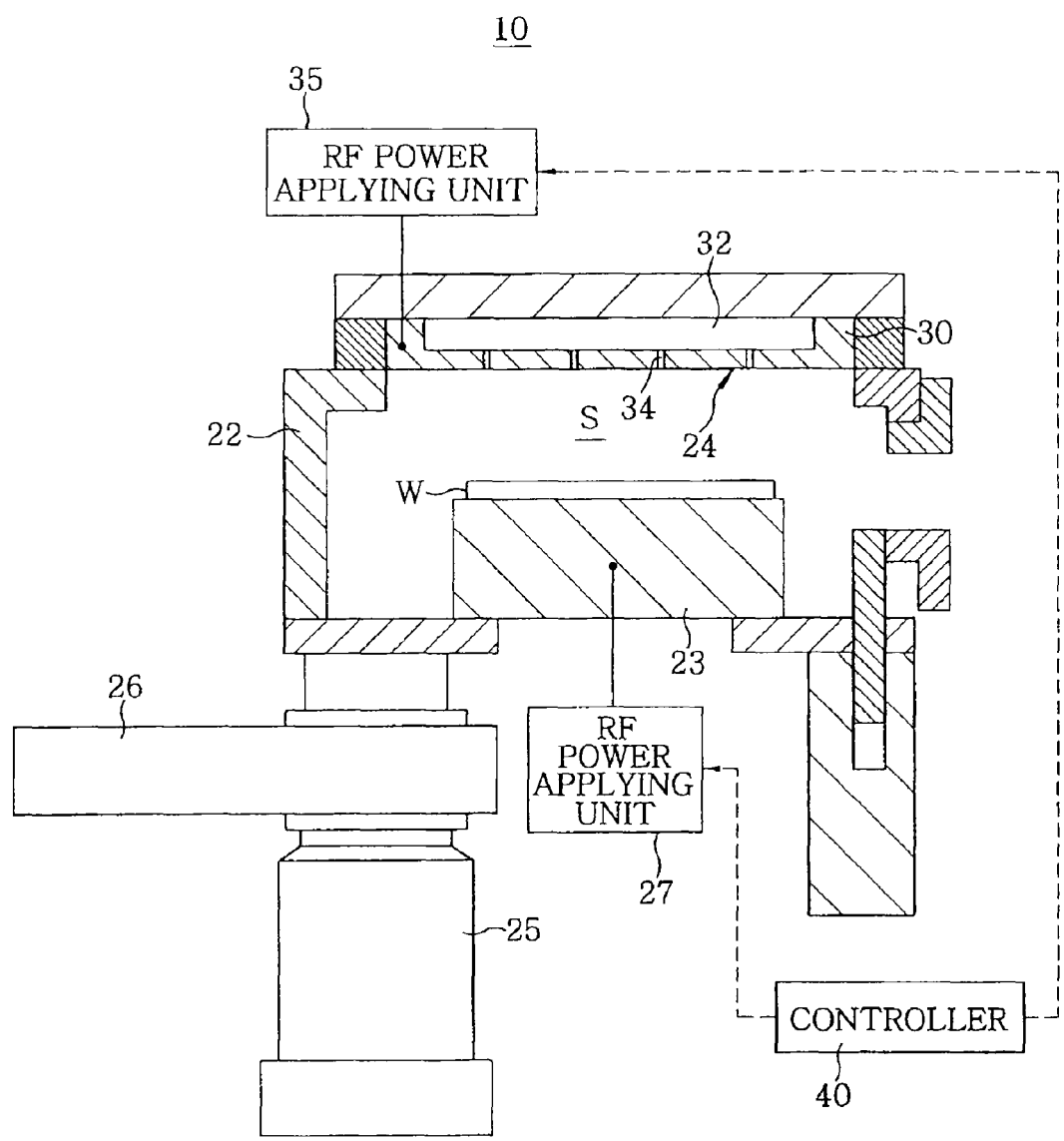
FIG. 1 is a cross sectional view showing a configuration of a substrate processing apparatus in accordance with an embodiment of the present invention.

FIG. 1 is a cross sectional view showing a configuration of a substrate processing apparatus in accordance with an embodiment of the present invention.

In FIG. 1, a substrate processing apparatus 10 is a substrate processing apparatus with two (upper and lower) RF power supplies and includes a processing room (chamber) 22, a mounting table 23 disposed within the chamber 22 to mount thereon a wafer W, a shower head 24 disposed to face the mounting table 23 at an upper part of the chamber 22, a turbo molecular pump (TMP) 25 for exhausting a gas or the like from the chamber 22, and an adaptive pressure control (APC) valve 26, as a variable butterfly valve, interposed between the chamber 22 and the TMP 25 and for controlling an internal pressure of the chamber 22.

The mounting table 23 is connected with an RF power applying unit 27 serving as a bias power applying unit which supplies an RF power of, e.g., 2 MHz to the mounting table 23. Accordingly, the mounting table 23 serves as a lower electrode. The mounting table (hereinafter, also referred to as "lower electrode") 23 discharges the RF power from the RF power applying unit 27 into a process space S.

The shower head 24 includes a disc-shaped gas supply unit 30 having a buffer room 32. The buffer room 32 communicates with the inside of the chamber 22 via a plurality of gas vent holes 34.

The shower head 24 is connected with an RF power applying unit 35 serving as an excitation power applying unit which generates an RF power for gas excitation. The RF power applying unit 35 supplies an RF power of, e.g., 60 MHz to the shower head 24. Accordingly, the shower head 24 serves as an upper electrode. The shower head (hereinafter, also referred to as "upper electrode") 24 discharges the RF power from the RF power applying unit 35 into the process space S.

The RF power applying units 27 and 35 are electrically connected to a controller 40 via respective lead wires. The controller 40 independently changes outputs of the RF power applying units 27 and 35 at respective certain timings. Here, the change of outputs includes setting the outputs to 0 by turning off the RF power applying units 27 and 35. In addition, the certain timings refer to preset timings. For example, the outputs of the RF power applying units 27 and 35 may be repeatedly changed with intervals of 10 ms and 100 μs, respectively. In this case, the intervals may be changed either sequentially or randomly. Also, the controller 40 may control the RF power applying units 27 and in such a way that the output of only the RF power applying unit 35 is changed (so-called pulse control), while the output of the RF power applying unit 27 is not changed, i.e., remains in the ON state.

Within the chamber 22 of the substrate processing apparatus 10, when RF power is discharged from the lower electrode 23 and the upper electrode 24 into the process space S, a process gas supplied from the shower head 24 into the process space S is converted into a high density plasma to generate ions and radicals and the wafer W is subjected to an etching process by the ions and/or the radicals thus produced.

Figure 2:
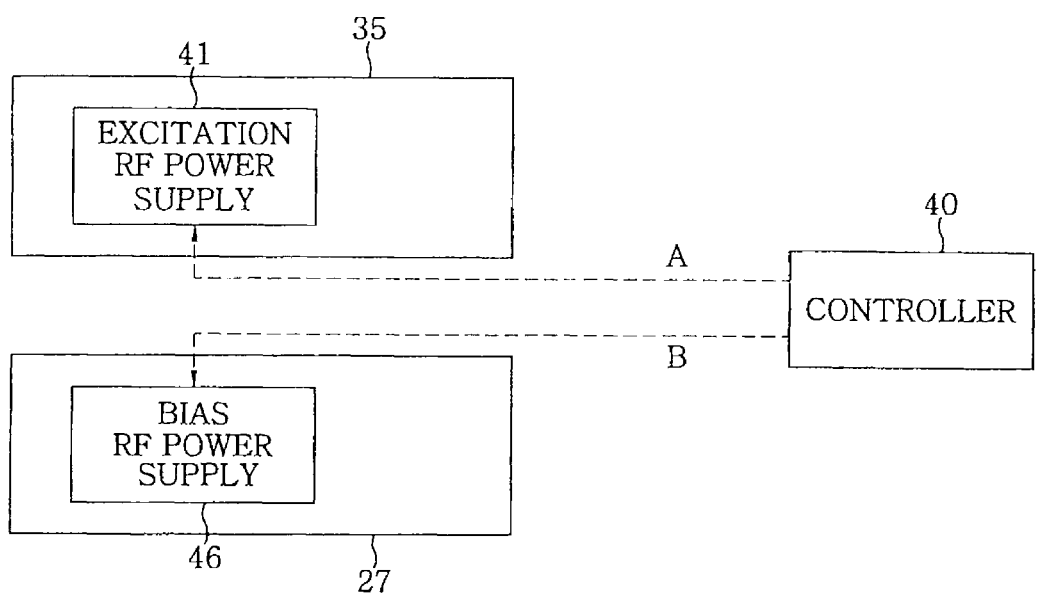
FIG. 2 is a block diagram showing configurations of RF power applying units in the substrate processing apparatus shown in FIG. 1.

FIG. 2 is a block diagram showing a configuration of the RF power applying units 27 and 35 in the substrate processing apparatus 10 shown in FIG. 1.

Referring to FIG. 2, the RF power applying unit 35 includes a matching unit (not shown) and an RF power supply for excitation having an RF oscillator and an RF amplifier. The RF power applying unit 27 includes a matching unit (not shown), a low pass filter (not shown), and an RF power supply 46 for bias having an RF oscillator and an RF amplifier.

The controller 40 includes a trigger signal generator, where a trigger signal A for the RF power applying unit 35 is inputted to the RF power supply 41 for excitation of the RF power applying unit 35, while a trigger signal B for the RF power applying unit 27 is inputted to the RF power supply 46 for bias of the RF power applying unit 27.

Then, the RF power supply 41 for excitation outputs the RF power for plasma generation at a predetermined timing according to the trigger signal A from the controller 40. Also, the RF power supply 46 for bias outputs the bias RF power for bias at a preset timing according to the trigger signal B from the controller 40.

The RF output of the RF power applying unit 35 is applied to the upper electrode 24 through the matching unit (not shown). The bias RF output of the RF power applying unit 27 is applied to the lower electrode 23 through the matching unit and the low pass filter (both not shown). The timings of the trigger signal A of the RF power applying unit 35 for gas excitation and the trigger signal B of the RF power applying unit 27 for bias are controlled in the controller 40.

When the wafer W serving as a processing target substrate is subjected to a plasma process using the above-configured substrate processing apparatus 10, the wafer W is first loaded into the chamber 22 and mounted on the mounting table 23.

Next, the internal pressure of the chamber 22 is set to, e.g., 3.3 Pa (25 mTorr) using the APC valve 26 or the like. The temperature of the wafer W is set to, e.g., 80° C. And, e.g., a $CF_4$ gas is supplied from the gas supply unit 30 of the shower head 24 into the chamber 22 at a flow rate of, e.g., 200 sccm. In addition, at preset timings, the RF power of, e.g., 60 MHz is applied from the RF power applying unit 35 to the upper electrode 24, while the RF power of, e.g., 2 MHz is supplied from the RF power applying unit 27 to the lower electrode 23 on which wafer W is mounted.

The RF power applied to the upper electrode 24 is discharged into the process space S, thereby exciting the process gas to generate a plasma by use of which various kinds of processes are performed. In addition, the plasma generated in the process space S is incident toward the wafer W mounted on the mounting table 23 by the RF power applied to the lower electrode 23.

Hereinafter, a first embodiment of the substrate processing method of the present invention will be described.

FIG. 3 is a timing diagram of the first embodiment of the substrate processing method of the present invention, showing timings at which the outputs of the RF power applying unit (hereinafter referred to as "RF1") 35 and the RF power applying unit (hereinafter referred to as "RF2") 27 are changed.

This embodiment represents a case where a pulse control, which allows outputs of both of RF1 and RF2 to be periodically changed, is performed and a pulse duration of RF1 is set to be smaller than that of RF2.

In FIG. 3, RF1 is ON/OFF-controlled with a predetermined period. When RF1 is in the ON state, an output with a predetermined waveform is applied to, e.g., the upper electrode 24. In FIG. 3, the control depicted in the lower side dashed box represents a control in accordance with this embodiment and the control depicted in the upper side dashed box represents a control for a comparative example.

In this example, the pulse duration of RF1 is set to be smaller than that of RF2, and in the control for the comparative example depicted in the upper side dashed box, RF2 remains in the ON state while a state of RF1 becomes ON/OFF twice. Accordingly, there occurs a case where RF2 is in the ON state while RF1 is in the OFF state. In this case, Vpp (amplitude) of the RF power in RF2 becomes large, which results in abnormal discharge or the like in the process room 22.

Therefore, in this embodiment, the output of RF2 is controlled to be in the OFF state or decreased, during the OFF state of RF1, as illustrated in the lower side dashed box of FIG. 3. This prevents Vpp of the RF power in RF2 from being increased, thereby allowing normal process while avoiding abnormal discharge or the like in the processing room 22. In addition, the pulse control of RF1 can suppress a gas dissociation by plasma generation. Further, the pulse control of RF2 can help achieving optimization of exhaustion time of reaction products. That is, exhaustion time of reaction products can be optimized by exhausting the reaction products while the pulse introduction is suspended.

Here, the decrease in the output of RF2 while RF1 is in the OFF state refers to setting the output of RF2 to be smaller than the set output of RF2 when the output of RF1 is its set output, and the amount of decrease in the output of RF2 is set to avoid a damage which may occur when RF2 becomes ON while RF1 is in the OFF state. That is, the amount of decrease in the output of RF2 is set to be within such a range that the amplitude (Vpp) of the RF power of RF2 does not exceed a set amplitude of the RF power of RF2 when the output of RF1 is its set output. More specifically, the output of RF2 is set to be less than a duty ratio (%) of pulse ON of RF1. For example, if the pulse-ON duty ratio of RF1 is 90%, the output of RF2 while RF1 is in the off state is set to be less than 90% of set output of RF2, and, if the pulse-ON duty ratio of RF1 is 50%, the output of RF2 while RF1 is in the off state is set to be less than 50% of its set output of RF2.

Here, the set output of RF1 refers to a higher power output thereof when RF1 is pulse-controlled. Likewise the set output of RF2 refers to a higher power output thereof when RF2 is pulse-controlled.

The pulse-ON duty ratio (%) of RF1 is represented by [(RF1 ON-duration)/(RF1 ON-duration+RF1 OFF-duration)]×100. In this embodiment, the pulse-ON duty ratio of RF1 is set to be, e.g., about 50% to about 98%.

Next, a modification of this embodiment will be described.

Figure 4A:
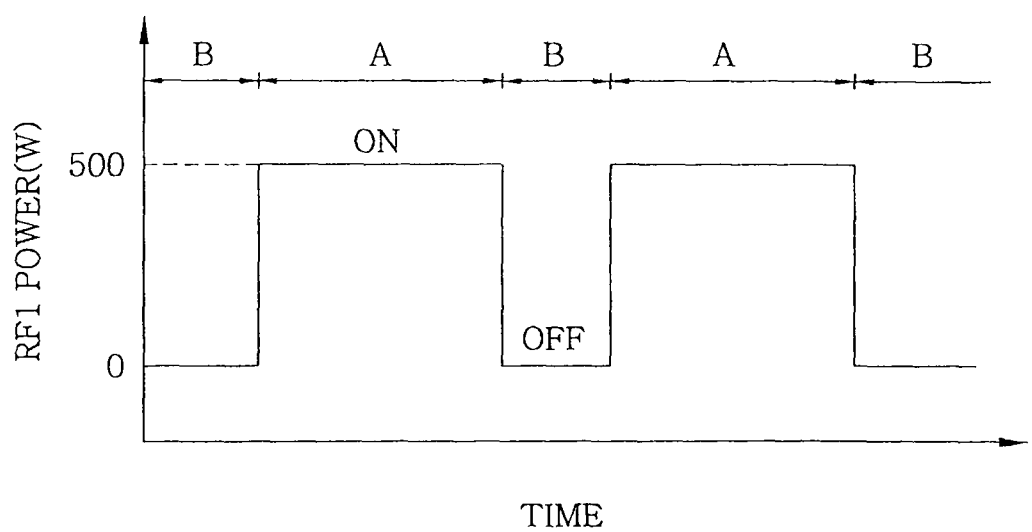
FIGS. 4A and 4B are views representing a relationship between ON/OFF control (pulse control) of RF1 and output waveform shown in FIG. 3.
Figure 4B:
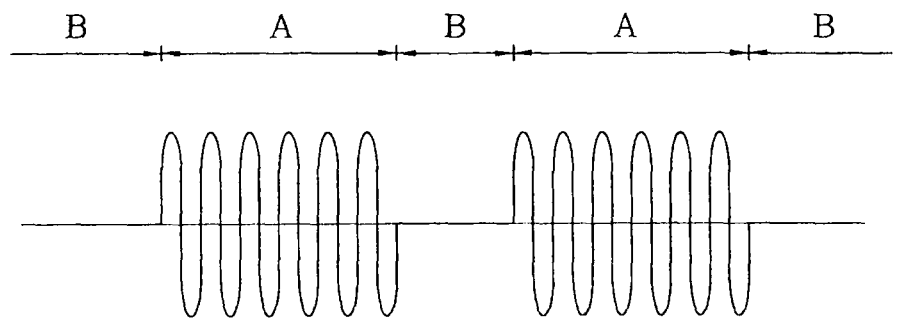

FIGS. 4A and 4B are views representing a relationship between ON/OFF control (pulse control) of RF1 and output waveform of RF1 shown in FIG. 3. As shown in FIG. 4A, preset output power of, e.g., 500 W is output when RF1 is in the ON state, while no power is output (i.e., output power is set to be 0) when RF1 is in the OFF state. FIG. 4B shows the waveform in the ON/OFF state of RF1.

In this embodiment, the pulse control of RF1 may include controlling its output to be a value of a predetermined percentage of its set output in addition to the ON/OFF control.

Figure 5A:
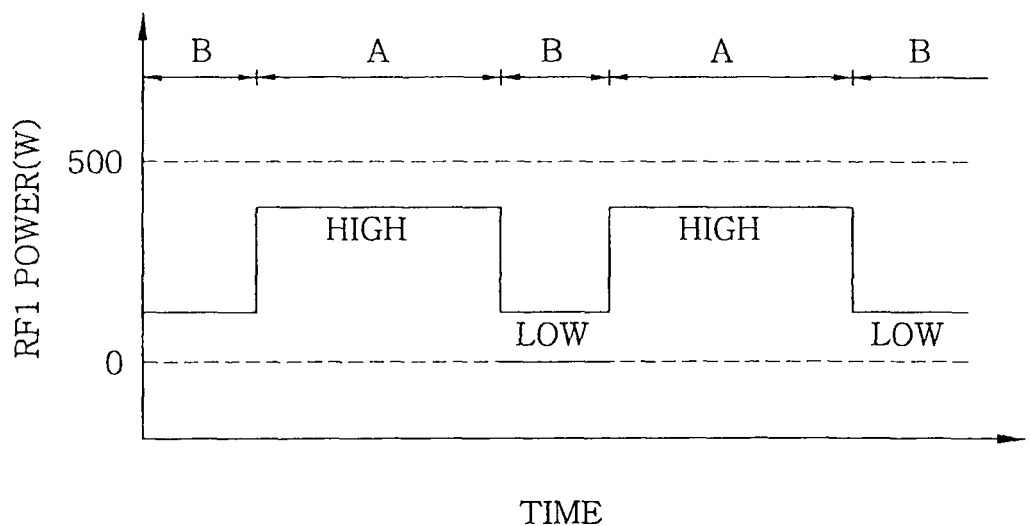
FIGS. 5A and 5B are views showing a relationship between a pulse control and output waveform when an output of RF1 is controlled to a high level close to an set output and a low level close to an output 0.
Figure 5B:
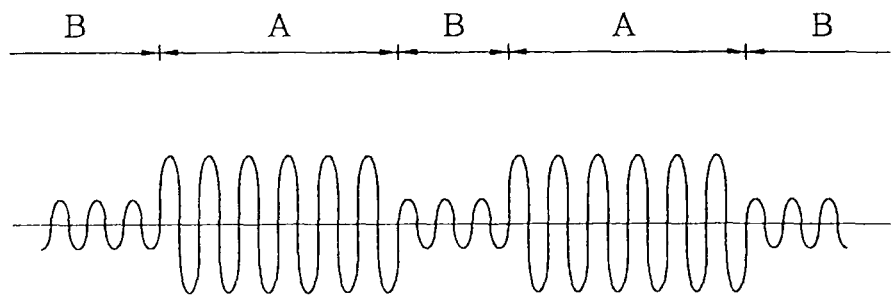

FIGS. 5A and 5B are views showing a relationship between the pulse control and the output waveform when the output of RF1 is controlled to a high level close to the set output and a low level close to an output 0. FIG. 5A shows a case where the output of RF1 alternates, in a pulsing manner, between set output power of 400 W (high level) and output power of, e.g., 100 W (low level) corresponding to 25% of the set output power. FIG. 5B shows output waveform corresponding to the high level and the low level. Thus, for the output of RF1 alternating between the high level and the low level in a pulsing manner, if RF1 is in the low level which does not contribute to plasma generation, the output of RF2 is controlled to be in the OFF state or to be decreased below the set output of RF2.

This also prevents Vpp of the RF power in RF2 from being increased, thereby allowing normal process while avoiding abnormal discharge or the like.

In this embodiment, it is preferable that a pulse frequency of the excitation RF power as the output of RF1 is changed in a range of 100 Hz to 100 kHz. In this case, the shortest period is about 10 µs and the longest period is about 10 ms. Also, it is preferable that a pulse frequency of the bias RF power as the output of RF2 is changed in a range of 1 Hz to 1 kHz. In this case, the shortest period is about 1 ms and the longest period is about 1 sec.

As described above, in the first embodiment and the modification of the substrate processing method, a condition for controlling the output of RF2 to be in the OFF state or to be decreased is defined by the output state of RF1 where RF1 is in the OFF state (in the first embodiment) or in the low level which does not contribute to plasma generation (in the modification).

In a pulse plasma as in the above embodiment, a plasma remains as afterglow plasma immediately after the output of RF1 has become OFF or has fallen to the low level which does not contribute to plasma generation.

Accordingly, if the condition for controlling the output of RF2 to be in the OFF state or to be decreased is defined by an internal state of the processing room 22, in lieu of the output state of RF1, the condition may be referred to as a case where no plasma exists or a case where afterglow plasma exists.

Next, a second embodiment of the substrate processing method of the present invention will be described.

Figure 6:
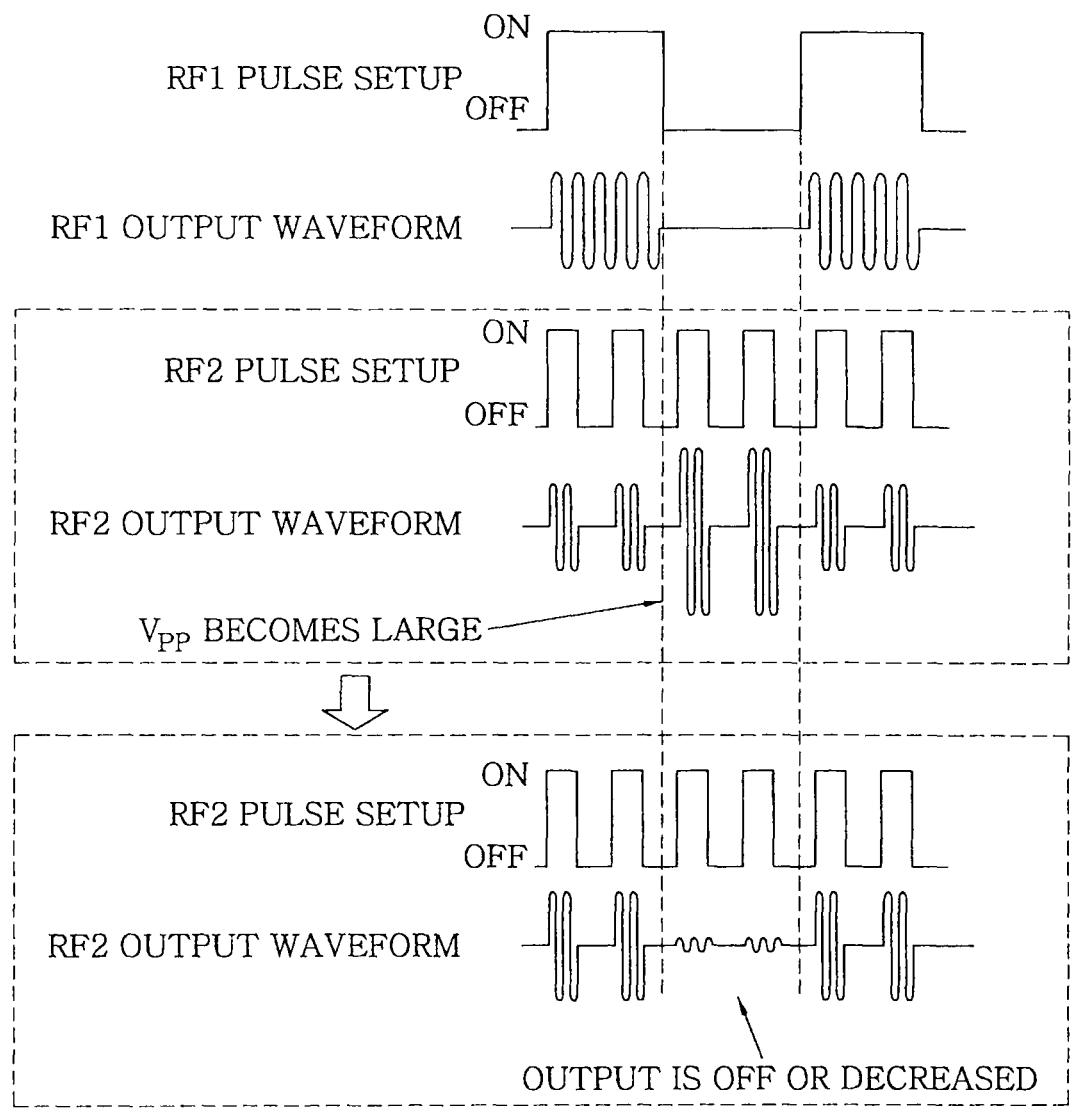
FIG. 6 is a timing diagram of a second embodiment of a substrate processing method of the present invention.

FIG. 6 is a timing diagram of a second embodiment of the substrate processing method of the present invention. This embodiment represents a case where both of RF1 and RF2 are pulse-controlled and a pulse duration of RF1 is set to be larger than that of RF2.

In FIG. 6, RF1 is ON/OFF-controlled with a predetermined period. When RF1 is in the ON state, an output with a predetermined waveform is applied from RF1 to, e.g., the upper electrode 24. In FIG. 6, the control depicted in the upper side dashed box represents a control for comparative example and the control depicted in the lower side dashed box represents a control in accordance with this embodiment.

In this example, the pulse duration of RF1 is set to be larger than that of RF2, and in the control for the comparative example depicted in the upper side dashed box, RF1 remains in the ON state while a state of RF2 becomes ON/OFF twice. After that, there occurs a case where RF2 is in the ON state while RF1 is in the OFF state. In this case, Vpp (amplitude) of the RF power in RF2 becomes large, which results in abnormal discharge or the like.

Accordingly, in this embodiment, the output of RF2 is controlled to be in the OFF state or decreased, during the OFF state of RF1, as illustrated in the lower side dashed box of FIG. 6.

This prevents an amplitude (Vpp) of the RF power in RF2 from exceeding an amplitude (Vpp) of the RF power in RF2 when the output of RF1 is its set output, thereby allowing normal process while avoiding abnormal discharge or the like in the processing room 22. In addition, the pulse control of RF1 can suppress a gas dissociation by plasma generation. Further, the pulse control of RF2 can help achieving optimization of exhaustion time of reaction products.

In this embodiment, the amount of decrease in the output of RF2 is similar to that of the first embodiment. Also, as in the above embodiment, the output of RF1 is not only controlled to be ON/OFF but also controlled to alternate between a high level and a low level close to output 0 in a pulsing manner, and the output of RF2 may be accordingly controlled.

In addition, in this embodiment, the condition for controlling the output of RF2 to be in the OFF state or to be decreased may also be referred to as a case where no plasma exists or a case where afterglow plasma exists.

Next, a third embodiment of the substrate processing method of the present invention will be described.

Figure 7:
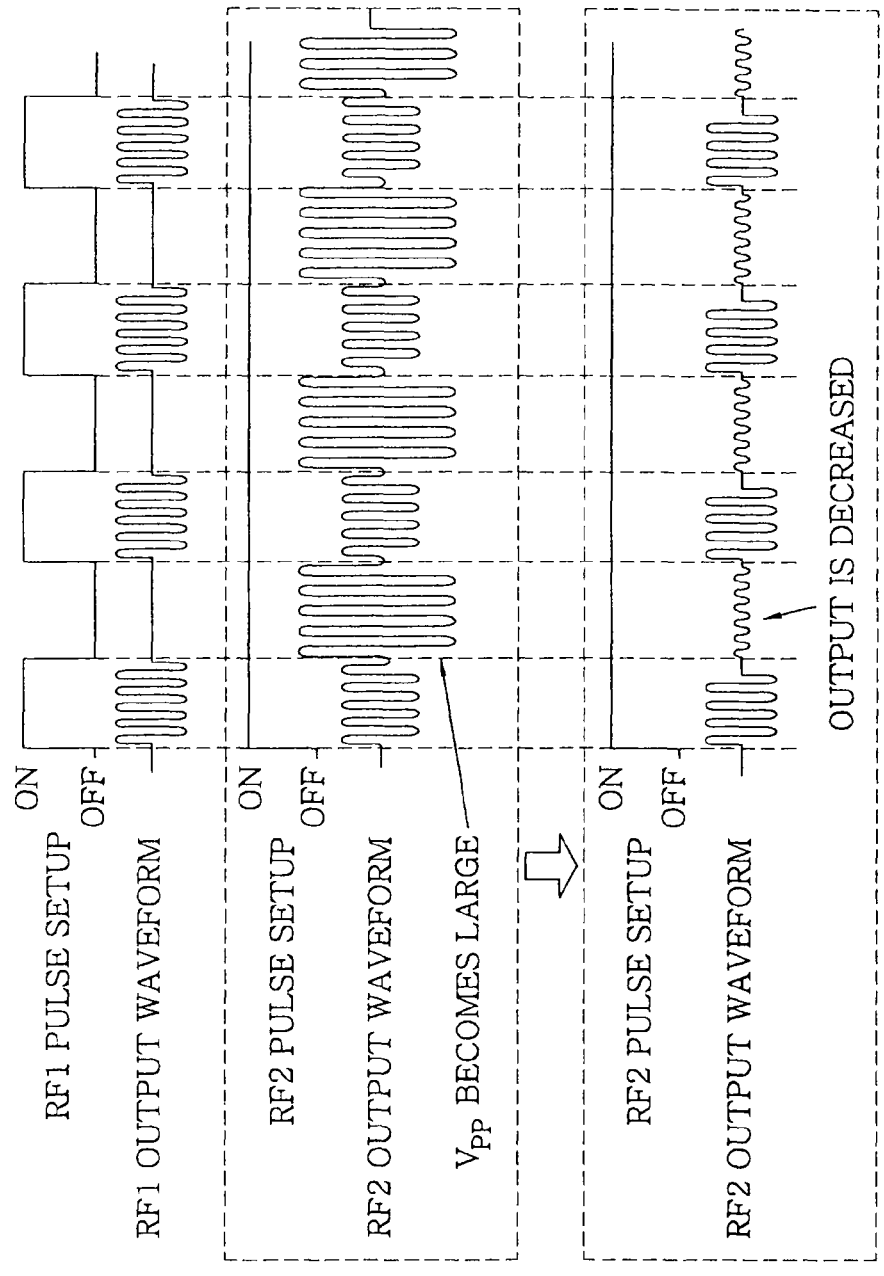
FIG. 7 is a timing diagram of a third embodiment of a substrate processing method of the present invention.

FIG. 7 is a timing diagram of a third embodiment of the substrate processing method of the present invention. This embodiment represents a case where only RF1 is pulse-controlled while RF2 remains in the ON state.

In FIG. 7, RF1 is ON/OFF-controlled with predetermined equi-intervals. When RF1 is in the ON state, an output with a predetermined waveform is applied from RF1 to, e.g., the upper electrode 24. In FIG. 7, the control depicted in the upper side dashed box represents a control for comparative example and the control depicted in the lower side dashed box represents a control in accordance with this embodiment.

Since RF2 remains in the ON state while RF1 is ON/OFF-controlled with the predetermined equi-intervals, there occurs a case where RF2 is in the ON state with RF1 in the OFF state. In this case, Vpp (amplitude) of the RF power in RF2 becomes large, which results in abnormal discharge or the like.

Accordingly, in this embodiment, the output of RF2 is controlled to be decreased during the OFF state of RF1, as illustrated in the lower side dashed box of FIG. 7. This prevents a Vpp of the RF power in RF2 from exceeding a Vpp of the RF power in RF2 when the output of RF1 is its set output, thereby allowing the bias RF power to be normally maintained. In addition, the pulse control of RF1 can suppress a gas dissociation by plasma generation.

In this embodiment, similarly to the first embodiment, the amount of decrease in the output of RF2 is set to avoid a damage which may occur when RF2 becomes ON while RF1 is in the OFF state. That is, the amount of decrease in the output of RF2 is set to be within such a range that the Vpp of the RF power of RF2 does not exceed an amplitude of the RF power of RF2 when RF1 is in the ON state.

In this embodiment, as in the above embodiments, the output of RF1 is not only controlled to be ON/OFF but also controlled to alternate between a high level and a low level close to output 0 in a pulsing manner, and the output of RF2 may be accordingly controlled.

In addition, in this embodiment also, the condition for controlling the output of RF2 to be in the OFF state or to be decreased may be referred to as a case where no plasma exists or a case where afterglow plasma exists.

Figure 8:
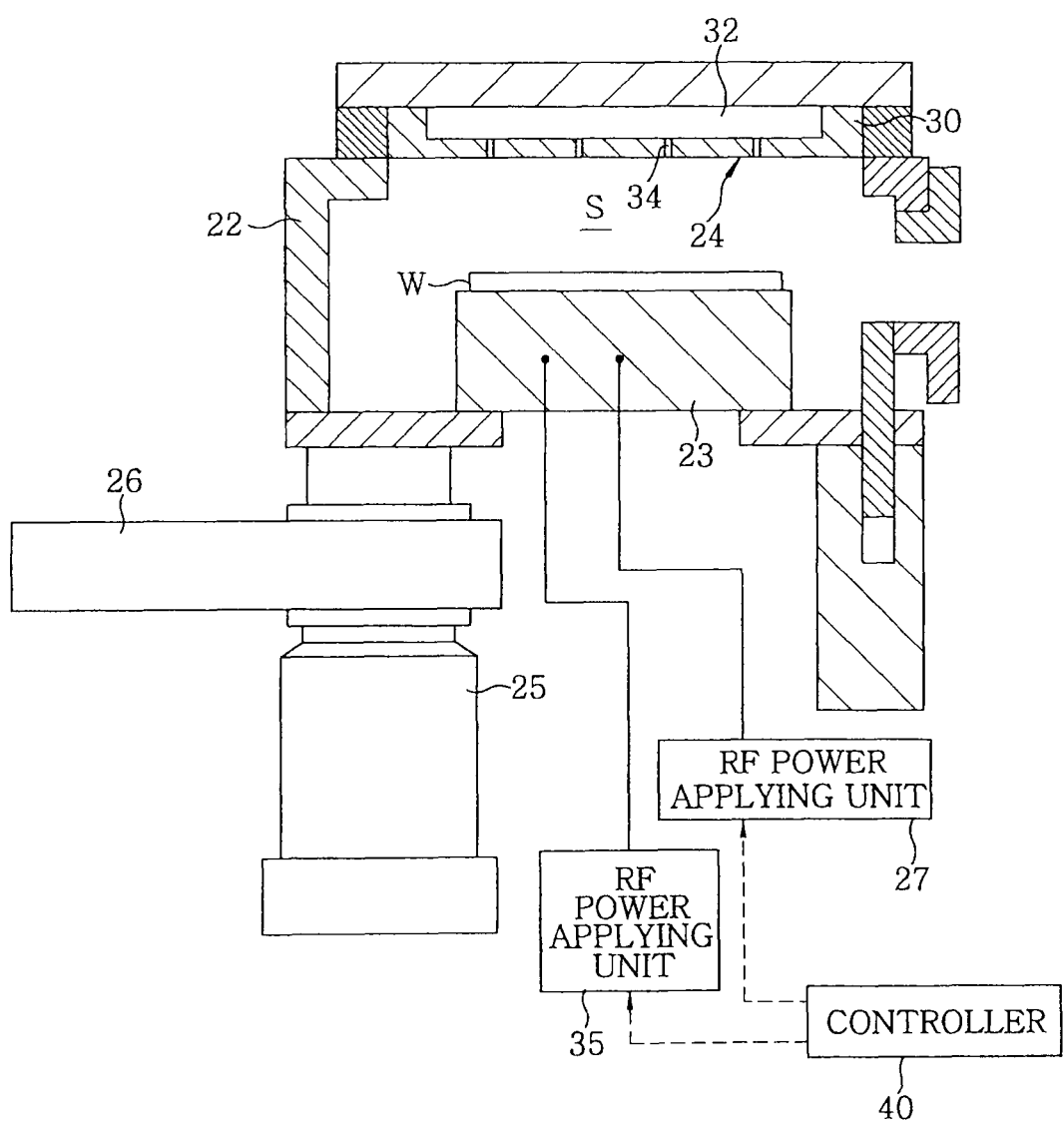
FIG. 8 is a cross sectional view showing a configuration of a substrate processing apparatus applied to a modification of the third embodiment of the substrate processing method of the present invention.

Although it has been illustrated in the above embodiment of the substrate processing apparatus that the RF power applying unit 35 for outputting the RF power having a relatively higher frequency is connected to the upper electrode 24, and the RF power applying unit 27 for outputting the RF power having a relatively lower frequency is connected to the lower electrode 23. Instead, as shown in FIG. 8, the RF power applying unit 35 for outputting the RF power having the relatively higher frequency and the RF power applying unit 27 for outputting the RF power having the relatively lower frequency may be together connected to the lower electrode 23. The substrate processing apparatus as configured above can have the same effects as the above-described embodiments.

Next, another embodiment of the substrate processing apparatus of the present invention will be described.

Figure 9:
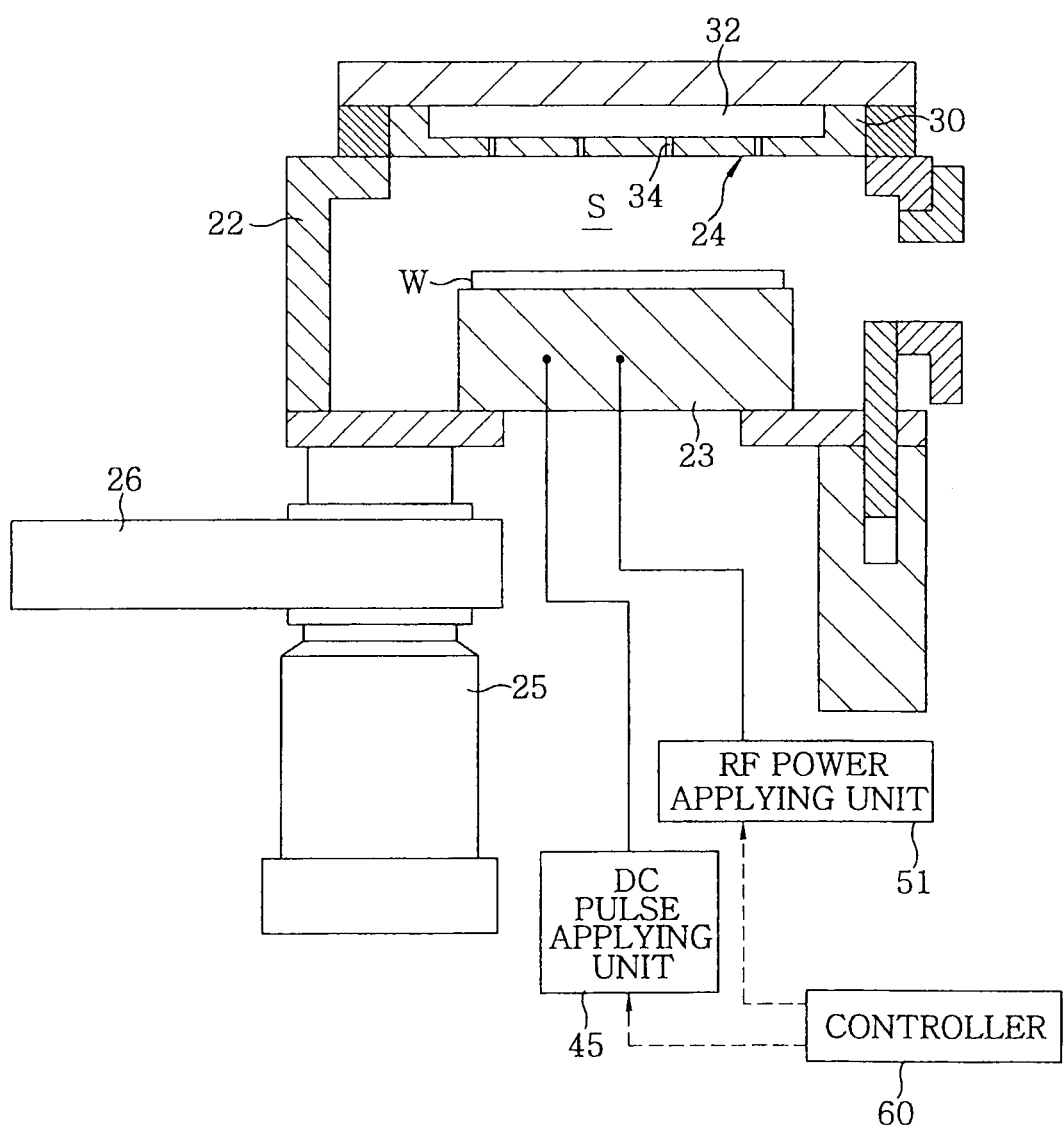
FIG. 9 is a cross sectional view showing a configuration of a substrate processing apparatus in accordance with another embodiment of the present invention.

FIG. 9 is a cross sectional view showing a configuration of a substrate processing apparatus in accordance with another embodiment of the present invention.

In FIG. 9, a substrate processing apparatus 50 is a substrate processing apparatus to which a DC voltage is applied as a bias voltage and includes a processing room (chamber) 22, a mounting table 23 disposed within the chamber 22 to mount thereon a wafer W, a shower head 24 disposed to face the mounting table 23 at an upper part of the chamber 22, a turbo molecular pump (TMP) 25 which exhausts a gas or the like from the chamber 22, and an adaptive pressure control (APC) valve 26 interposed between the chamber 22 and the TMP 25, as a variable butterfly valve for controlling an internal pressure of the chamber 22.

The mounting table 23 is connected with an RF power applying unit 51 and a DC pulse (voltage) applying unit 45. The RF power applying unit 51 applies the excitation RF power of a relatively higher frequency of, e.g., 60 MHz to the mounting table 23. Accordingly, the mounting table 23 serves as a lower electrode which discharges the RF power into a process space S formed between the mounting table 23 and the shower head 24. The DC pulse applying unit 45 applies, to the lower electrode 23, a DC voltage for bias of, e.g., 100 to 1200 V for ion attraction. In this case, cations of plasma in the process space S are attracted into the lower electrode 23 applied by the DC voltage. Thus, a plasma state in the process space S is controlled.

The shower head (upper electrode) 24 includes a disc-shaped gas supply unit 30 having a buffer room 32. The buffer room 32 communicates with the inside of the chamber 22 via a plurality of gas vent holes 34.

The RF power applying unit 51 and the DC pulse applying unit 45 are electrically connected to a controller via respective lead wires. The controller 60 independently controls ON/OFF states of the RF power applying unit 51 and the DC pulse applying unit 45 at respective certain timings. Here, the certain timings refer to preset timings. For example, the RF power applying unit 51 and the DC pulse applying unit 45 may be controlled to be repeatedly in the ON/OFF states with intervals of 100 μs and 1 μs, respectively. In this case, the intervals may be changed either sequentially or randomly.

Within the chamber 22 of the substrate processing apparatus 50, as described above, when RF power is discharged from the lower electrode 23 into the process space S, the process gas supplied from the shower head 24 into the process space S is converted into a high density plasma to generate ions or radicals and the wafer W is subjected to an etching process by the ions and/or the radicals thus produced.

Figure 10:
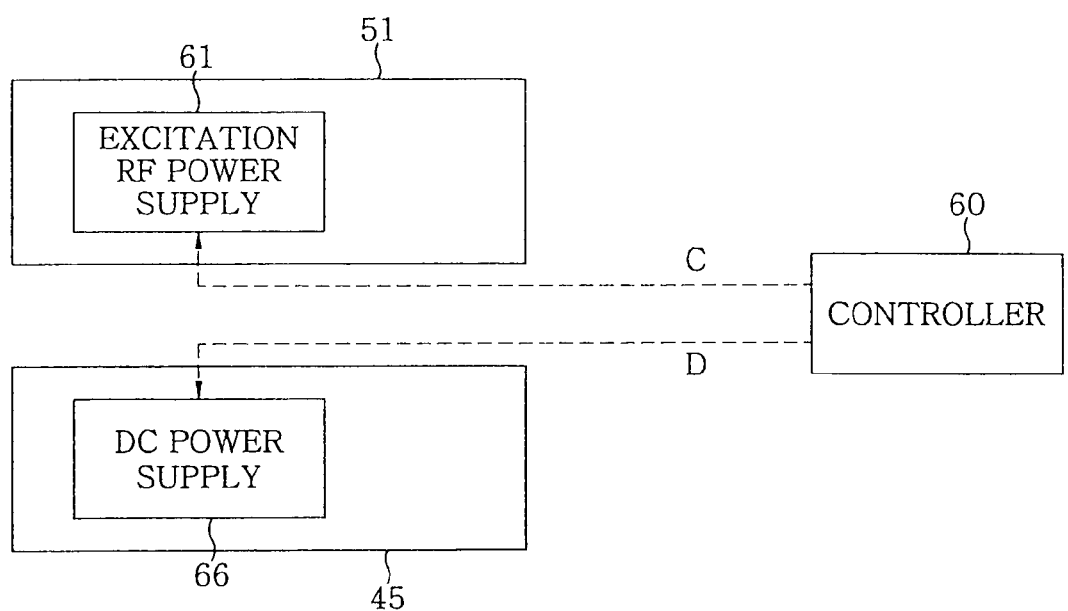
FIG. 10 is a view illustrating configurations of an RF power applying unit and a DC pulse applying unit shown in FIG. 9.

FIG. 10 is a view illustrating configurations of the RF power applying unit 51 and the DC pulse applying unit 45 shown in FIG. 9. In FIG. 10, the RF power applying unit 51 includes an RF power supply 61 for excitation and a matching unit (not shown). The DC pulse applying unit 45 includes a DC power supply 66 and a low pass filter (not shown).

The controller 60 includes a trigger signal generator. A trigger signal C for the RF power applying unit 51 is inputted to the RF power supply 61 for excitation of the RF power applying unit 51, while a trigger signal D for the DC pulse applying unit 45 is inputted to the DC power supply 66 of the DC pulse applying unit 45.

Then, the RF power supply 61 for excitation of the RF power applying unit 51 outputs the RF power for plasma generation at a predetermined timing according to the trigger signal C from the controller 60. The DC power supply 66 of the DC pulse applying unit 45 outputs a DC voltage to be applied to the lower electrode 23 at a predetermined timing according to the trigger signal D from the controller 60.

The RF output of the RF power applying unit 51 is applied to the lower electrode 23 through the matching unit (not shown). The output voltage of the DC pulse applying unit 45 is applied to the lower electrode 23 through the low pass filter (not shown). The timings of the trigger signal C for the RF power applying unit 51 and the trigger signal D for the DC pulse applying unit 45 are controlled in the controller 60.

Next, a fourth embodiment of the substrate processing method of the present invention will be described.

Figure 11:
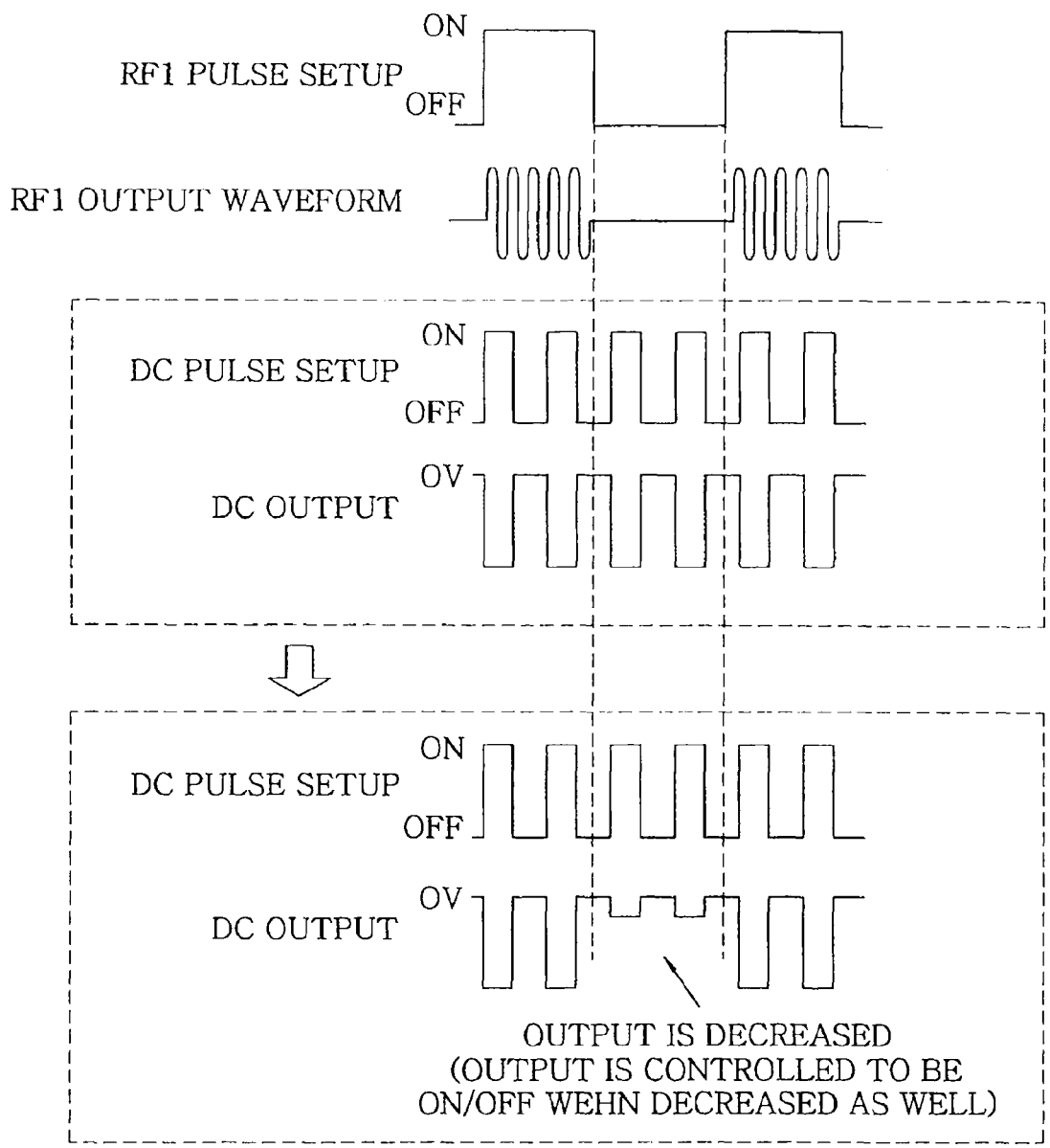
FIG. 11 is a timing diagram of a fourth embodiment of a substrate processing method of the present invention.

FIG. 11 is a timing diagram of a fourth embodiment of the substrate processing method of the present invention. This embodiment represents a case where RF1 applied to the lower electrode 23 on which a substrate is mounted, and a DC voltage for bias are controlled at a preset timing in a pulsing manner.

In FIG. 11, RF1 is ON/OFF-controlled with predetermined equi-intervals. When RF1 is in the ON state, an output with a predetermined waveform is applied from RF1 to the lower electrode 23. In FIG. 11, the control depicted in the upper side dashed box represents a control for a comparative example and the control depicted in the lower side dashed box represents a control in accordance with this embodiment.

The pulse duration of RF1 is set to be larger than that of the DC pulse and, in the control for the comparative example depicted in the upper side dashed box, RF1 remains in the ON state while a state of the DC pulse becomes twice ON/OFF. After that, there occurs a case where the DC pulse is in the ON state while RF1 is in the OFF state. In this case, a load to a DC pulse circuit may become large, which may result in a damage to the circuit.

Accordingly, in this embodiment, the output of the DC pulse is controlled to be decreased below its set value while RF1 is in the OFF state, as illustrated in the lower side dashed box of FIG. 11. The output of the DC pulse is also controlled not to become zero. This prevents a load in the DC pulse circuit from being increased during the OFF state of RF1, thereby preventing the DC pulse circuit from being damaged. In addition, the pulse control of the output of RF1 generating the plasma can suppress a gas dissociation by plasma generation and the pulse control of the DC pulse can achieve monochrome of ion energy.

In this embodiment, the amount of decrease in the output of the DC pulse during the OFF state of RF1 is set to avoid a damage which may occur when the DC pulse becomes ON while RF1 is in the OFF state. That is, the amount of decrease in the output of the DC pulse is set to be within such a range that the amount of heat generated by applying DC voltage to RF1 whose output is in the OFF state does not exceed the amount of heat generated by applying DC voltage to RF1 whose output is its set output. More specifically, the output of the DC pulse applying unit 45 is set to be less than a pulse-ON duty ratio (%) of RF1. For example, if the pulse-ON duty ratio of RF1 is 90%, the output of the DC pulse applying unit 45 is set to be less than 90% of the set output of the DC pulse applying unit 45, and, if the pulse-ON duty ratio of RF1 is 50%, the output of the DC pulse applying unit 45 is set to be less than 50% of the set output of the DC pulse applying unit 45.

In this embodiment, in addition to controlling the output of RF1 to be ON/OFF as in the above embodiments, the output of RF1 may be controlled to alternate between a high level and a low level close to output 0 in a pulse manner, and the output of the DC pulse may be controlled to be decreased when the output of RF1 is in the OFF state or in the low level.

In addition, in this embodiment, the condition for controlling the output of the DC pulse to be decreased may be referred to as a case where no plasma exists or a case where afterglow plasma exists.

In the present embodiment, the substrate to be subjected to the plasma treatment is not limited to a wafer for semiconductor devices. For example, the substrate may be one of various kinds of a substrate, which can be used in a flat panel display (FPD) or the like including a liquid crystal display (LCD), a photomask, a CD substrate, a print substrate or the like.

The purpose of the present invention can be achieved by providing a system or an apparatus with a storage medium or the like storing program codes of software realizing the functions of the present embodiment and allowing a computer (or a central processing unit (CPU) or a microprocessor unit (MPU)) thereof to read and execute the program codes stored in the medium.

In this case, the program codes themselves read from the medium realize the functions of the aforementioned embodiment and the present invention includes the program codes and the medium storing the program codes.

The medium for providing the program codes may be, e.g., a Floppy (registered trademark) disk; a hard disk; an optical disk, e.g., a magneto-optical disk, CD-ROM, CD-R, CD-RW, DVD-ROM, DVD-RAM, DVD-RW, DVD+RW or the like; a magnetic tape; a nonvolatile memory card; ROM; or the like. The program codes may also be downloaded through networks.

The functions of the aforementioned embodiment can be realized by executing the program codes read by the computer. Alternatively, an operating system (OS) or the like operating on the computer can execute a part or the whole of the actual processing in accordance with the instructions of the program codes and the functions of the embodiment can be realized by the processing executed by the OS or the like.

In addition, the program codes can be read from a storage and inputted to a memory in a built-in function extension board or an external function extension unit of a computer and the functions of the embodiment can be realized by the processing of a CPU or the like in the extension board or the extension unit, which executes the extension function thereof according to the instructions of the program codes to perform a part or the whole of the actual processing.

While the invention has been shown and described with respect to the embodiments, it will be understood by those skilled in the art that various changes and modification may be made without departing from the scope of the invention as defined in the following claims.

What is claimed is:

1. A substrate processing method using a substrate processing apparatus including a chamber for accommodating a substrate, a lower electrode disposed in the chamber to mount the substrate, a first RF power applying unit for applying an RF power for plasma generation to the lower electrode, and a second RF power applying unit for applying an RF power for bias to the lower electrode, the method comprising:
controlling the first RF power applying unit for plasma generation to be intermittently changed by changing an output of the first RF power applying unit at a predetermined timing;
controlling the second RF power applying unit to apply RF power for bias to the lower electrode during application of power by the first RF power applying unit to generate a plasma such that, during a first period in which the first RF power applying unit is applying power to generate a plasma, the second RF power applying unit is continuously applying power throughout the first period or is applying power with a plurality of pulses throughout the first period; and
the method further including controlling the second RF power applying unit such that during a second period if no plasma state or an afterglow state exists in the chamber by a control of the first RF power applying unit, an output of the second RF power applying unit is controlled to be in an OFF state or decreased below an output of the second RF power applying unit when the output of the first RF power applying unit is a set output.

2. The substrate processing method of claim 1, wherein, the output of the second RF power applying unit is adjusted to apply power at a decreased level greater than zero if no plasma state or an afterglow state exists and such that an amplitude (Vpp) of the RF power for bias when the output of the second RF power applying unit is decreased does not exceed an amplitude (Vpp) of the RF power for bias when the output of the first RF power applying unit is the set output.

3. The substrate processing method of claim 1, wherein a period of time during which the output of the second RF power applying unit is in the OFF state or decreased is longer than a period of time during which no plasma state or the afterglow state exists in the chamber by the control of the first RF power applying unit.

4. The substrate processing method of claim 1, wherein the RF power for bias is controlled to be intermittently changed by making the second RF power applying unit switch between an ON state and one of an OFF state and power-decreased state at a preset timing.

5. The substrate processing method of claim 4, wherein a pulse duration during which the output of the first RF power applying unit is changed is different from a pulse duration during which the output of the second RF power applying unit is changed.

6. The substrate processing method of claim 5, wherein a pulse frequency at which the output of the first RF power applying unit is changed ranges from 100 Hz to 100 kHz and a pulse frequency at which the output of the second RF power applying unit is changed ranges from 1 Hz to 1 kHz.

7. A substrate processing method using a substrate processing apparatus including a chamber for accommodating a substrate, a lower electrode disposed in the chamber to mount the substrate, an RF power applying unit for applying an RF power for plasma generation to the lower electrode, and a DC voltage applying unit for applying a DC voltage for bias to the lower electrode,
controlling the RF power applying unit for plasma generation to be intermittently changed by changing an output of the RF power applying unit at a predetermined timing;
controlling the DC voltage applying unit to apply DC voltage for bias to the lower electrode during application of power by the RF power applying unit to generate a plasma such that, during a first period in which the RF power applying unit is applying power to generate a plasma, the DC voltage applying unit is continuously applying a voltage throughout the first period or is applying a voltage with a plurality of pulses throughout the first period; and
the method further including controlling the DC voltage applying unit such that during a second period if no plasma state or an afterglow state exists in the chamber by a control of the RF power applying unit, an output of the DC voltage applying unit is controlled to be decreased below an output of the DC voltage applying unit when the output of the RF power applying unit is a set output.

8. The substrate processing method of claim 7, wherein, the output of the DC voltage applying unit is adjusted such that an amount of heat generated by the DC voltage applied to the lower electrode when the output of the DC voltage applying unit is decreased does not exceed an amount of heat generated by the DC voltage applied to the lower electrode when the output of the RF power applying unit is the set output.

9. The substrate processing method of claim 7, wherein a period of time during which the output of the DC voltage applying unit is decreased is longer than a period of time during which no plasma state or an afterglow state exists in the chamber by the control of the RF power applying unit.

10. The substrate processing method of claim 7, wherein a DC voltage applied to the lower electrode is controlled to be intermittently changed by decreasing the output of the DC voltage applying unit at a preset timing.

11. The substrate processing method of claim 10, wherein a pulse duration during which the output of the RF power applying unit is changed is different from a pulse duration during which the output of the DC voltage applying unit is changed.

12. The substrate processing method of claim 11, wherein a pulse frequency at which the output of the RF power applying unit is changed ranges from 100 Hz to 100 kHz and a pulse frequency at which the output of the DC voltage applying unit is changed ranges from 100 kHz to 1 MHz.

13. A substrate processing method using a substrate processing apparatus including a chamber for accommodating a substrate, a lower electrode disposed in the chamber to mount the substrate, a first RF power applying unit for applying an RF power for plasma generation into the chamber, and a second RF power applying unit for applying an RF power for bias to the lower electrode, the method comprising:
    controlling the RF power for plasma generation to be intermittently changed by changing an output of the first RF power applying unit at a predetermined timing; and
    if no plasma state or an afterglow state exists in the chamber by a control of the first RF power applying unit while the second RF power applying unit is in an ON state, an output of the second RF power applying unit not to be in an OFF state and to be decreased below an output of the second RF power applying unit when the output of the first RF power applying unit is a set output.

14. The substrate processing method of claim 13, wherein if no plasma state or the afterglow state exists in the chamber by the control of the first RF power applying unit while the second RF power applying unit is in an ON state, controlling the output of the second RF power applying unit to be set to be less than a set output of the second RF power applying unit multiplied by a duty ratio of the first RF power applying unit.

15. The substrate processing method of claim 13, the method further comprising:
    controlling the second RF power applying unit to apply RF power for bias to the lower electrode during application of power by the first RF power applying unit to generate a plasma such that, during a period in which the first RF power applying unit is applying power to generate a plasma, the second RF power applying unit is continuously applying power throughout the period or is applying power with a plurality of pulses throughout the period.

16. A substrate processing method using a substrate processing apparatus including a chamber for accommodating a substrate, a lower electrode disposed in the chamber to mount the substrate, an RF power applying unit for applying an RF power for plasma generation into the chamber, and a DC voltage applying unit for applying a DC voltage for bias to the lower electrode,
    controlling the RF power for plasma generation to be intermittently changed by changing an output of the RF power applying unit at a predetermined timing; and
    if no plasma state or an afterglow state exists in the chamber by a control of the RF power applying unit while the DC voltage applying unit is in an ON state, an output of the DC voltage applying unit not to be zero and to be decreased below an output of the DC voltage applying unit when the output of the RF power applying unit is a set output.

17. The substrate processing method of claim 16, wherein if no plasma state or the afterglow state exists in the chamber by the control of the RF power applying unit while the DC voltage applying unit is in an ON state, controlling an output of the DC voltage applying unit to be set to be less than a set output of the DC voltage applying unit multiplied by a duty ratio of the RF power applying unit.

18. The substrate processing method of claim 16, the method further comprising:
    controlling the DC voltage applying unit to apply DC voltage for bias to the lower electrode during application of power by the RF power applying unit to generate a plasma such that, during a period in which the RF power applying unit is applying power to generate a plasma, the DC voltage applying unit is continuously applying a voltage throughout the period or is applying a voltage with a plurality of pulses throughout the period.

* * * * *